(12) United States Patent
Yang et al.

(10) Patent No.: US 11,869,845 B2
(45) Date of Patent: Jan. 9, 2024

(54) SEMICONDUCTOR PACKAGE DEVICE AND SEMICONDUCTOR WIRING SUBSTRATE THEREOF

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Sheng-Fan Yang, Hsinchu (TW); Wei-Chiao Wang, Hsinchu (TW); Yi-Tzeng Lin, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/823,063

(22) Filed: Aug. 29, 2022

(65) Prior Publication Data
US 2023/0387030 A1   Nov. 30, 2023

(30) Foreign Application Priority Data
May 26, 2022   (TW) .................................. 111119707

(51) Int. Cl.
*H01L 23/52*   (2006.01)
*H01L 23/538*   (2006.01)
(Continued)

(52) U.S. Cl.
CPC .... *H01L 23/5386* (2013.01); *H01L 23/49816* (2013.01); *H01L 23/49822* (2013.01);
(Continued)

(58) Field of Classification Search
CPC ........... H01L 23/5386; H01L 23/49816; H01L 23/49822; H01L 23/49833;
(Continued)

(56) References Cited

U.S. PATENT DOCUMENTS

| 10,181,438 B2 | 1/2019 | Lee et al. |
| 11,324,119 B1 | 5/2022 | Dsilva et al. |

(Continued)

FOREIGN PATENT DOCUMENTS

| TW | I621237 B | 4/2018 |
| TW | I708355 B | 10/2020 |

*Primary Examiner* — Nicholas J Tobergte
(74) *Attorney, Agent, or Firm* — CKC & Partners Co., LLC

(57) ABSTRACT

A semiconductor wiring substrate includes a first circuit layer, a second circuit layer and a first dielectric layer. The first circuit layer includes a plurality of first signal traces and a plurality of first ground traces, wherein the first signal traces and the first ground traces are alternatively arranged on the first circuit layer, and one of the first signal traces is spaced at a first spacing from adjacent one of the first ground traces. The first dielectric layer is between the first circuit layer and the second circuit layer and has a first thickness in an arrangement direction of the first circuit layer, the first dielectric layer and the second circuit layer, wherein the first spacing substantially ranges from 0.78 to 1.96 times the first thickness.

20 Claims, 6 Drawing Sheets

(51) Int. Cl.
*H01L 25/065* (2023.01)
*H01L 23/498* (2006.01)
*H01L 23/552* (2006.01)
*H01L 23/00* (2006.01)

(52) U.S. Cl.
CPC .. *H01L 23/49833* (2013.01); *H01L 23/49838* (2013.01); *H01L 23/5385* (2013.01); *H01L 23/552* (2013.01); *H01L 25/0652* (2013.01); H01L 24/16 (2013.01); H01L 2224/16235 (2013.01); H01L 2924/1431 (2013.01); H01L 2924/1434 (2013.01)

(58) Field of Classification Search
CPC ........... H01L 23/49838; H01L 23/5385; H01L 23/552; H01L 25/0652; H01L 24/16
See application file for complete search history.

(56) References Cited

U.S. PATENT DOCUMENTS

| | | | |
|---|---|---|---|
| 2008/0111242 A1* | 5/2008 | Lin | H01L 23/5286 257/758 |
| 2009/0167334 A1* | 7/2009 | Fjelstad | H01L 23/49827 257/773 |
| 2017/0374739 A1 | 12/2017 | Warwick et al. | |
| 2019/0148280 A1 | 5/2019 | Lee et al. | |

* cited by examiner

SEMICONDUCTOR PACKAGE DEVICE AND SEMICONDUCTOR WIRING SUBSTRATE THEREOF

CROSS-REFERENCE TO RELATED APPLICATION

This application claims priority to Taiwan Application Serial Number 111119707, filed May 26, 2022, which is herein incorporated by reference in its entirety.

BACKGROUND

Field of Invention

This disclosure relates to a semiconductor wiring substrate, and in particular to a semiconductor wiring substrate of a semiconductor package device.

Description of Related Art

With the increasing application of high-bandwidth memory, the requirements for data transfer rate and signal eye width also increase. Therefore, it is necessary to improve existing design to meet the requirements.

SUMMARY

An aspect of present disclosure relates to a semiconductor wiring substrate. The semiconductor wiring substrate includes a first circuit layer, a second circuit layer and a first dielectric layer. The first circuit layer includes a plurality of first signal traces and a plurality of first ground traces, wherein the first signal traces and the first ground traces are alternatively arranged on the first circuit layer, and one of the first signal traces is spaced at a first spacing from adjacent one of the first ground traces. The second circuit layer includes a plurality of second signal traces and a plurality of second ground traces, wherein the second signal traces and the second ground traces are alternatively arranged on the second circuit layer. The first dielectric layer is between the first circuit layer and the second circuit layer and has a first thickness in an arrangement direction of the first circuit layer, the first dielectric layer and the second circuit layer, wherein the first spacing substantially ranges from 0.78 to 1.96 times the first thickness.

Another aspect of present disclosure relates to a semiconductor package device. The semiconductor package device includes a first chip, a second chip, a package substrate and an interposer. The second chip is configured to perform a transmission of at least one signal with the first chip via at least one channel. The interposer includes a semiconductor wiring substrate, a first surface and a second surface, wherein the first surface and the second surface are opposite to each other, the first chip and the second chip are connected to the first surface, and the package substrate is connected to the second surface. The semiconductor wiring substrate includes at least one circuit layer and at least one dielectric layer, and a first circuit layer of the at least one circuit layer is electrically coupled between the second chip and the first chip to be a first channel of the at least one channel, so that the second chip and the first chip transmit a first signal of the at least one signal via the first circuit layer. The first circuit layer includes a plurality of first signal traces and a plurality of first ground traces, wherein the first signal traces and the first ground traces are alternatively arranged on the first circuit layer, and one of the first signal traces is spaced at a first spacing from adjacent one of the first ground traces. A first dielectric layer of the at least one dielectric layer has a first thickness in an arrangement direction of the at least one circuit layer and the at least one dielectric layer, and the first spacing substantially ranges from 0.78 to 1.96 times the first thickness.

DETAILED DESCRIPTION

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "coupled" or "connected" as used herein may mean that two or more elements are directly in physical or electrical contact, or are indirectly in physical or electrical contact with each other. It can also mean that two or more elements interact with each other.

The present disclosure provides a semiconductor package device and a semiconductor wiring substrate thereof, wherein the semiconductor wiring substrate of the present disclosure includes at least one circuit layer and at least one dielectric layer. Multiple embodiments of the semiconductor wiring substrate would be described below with reference to FIGS. 1-4.

Figure 1:
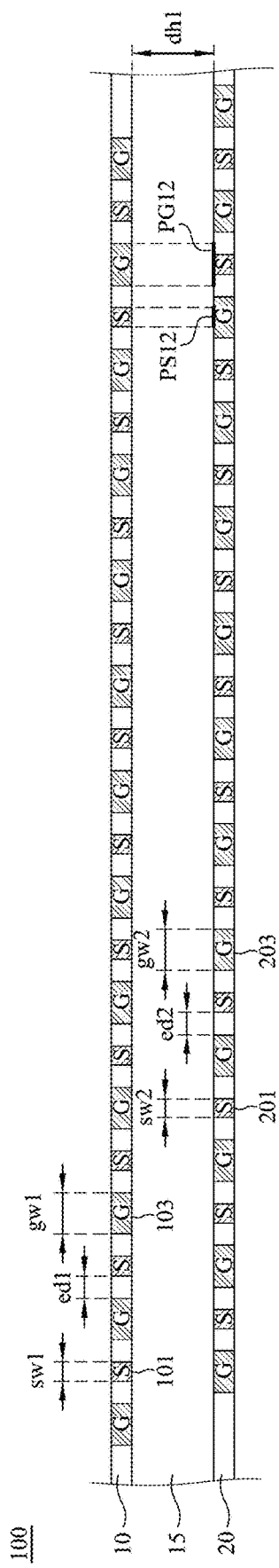
FIG. 1 is a partial schematic diagram of a semiconductor wiring substrate in accordance with some embodiments of the present disclosure.
Figure 1:
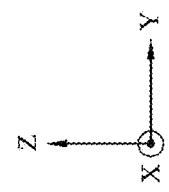

Referring to FIG. 1, FIG. 1 is a partial schematic diagram of a semiconductor wiring substrate 100 in accordance with some embodiments of the present disclosure. In some embodiments, as shown in FIG. 1, the semiconductor wiring substrate 100 includes a first circuit layer 10, a first dielectric layer 15 and a second circuit layer 20. In particular, the first circuit layer 10, the first dielectric layer 15 and the second circuit layer 20 are arranged sequentially along a Z-axis direction (i.e., an arrangement direction).

For clarity and convenience of description, in the drawings of the present disclosure, signal traces each is marked with "S", ground traces each is marked with "G", and power traces each is marked with "P".

In some embodiments, as shown in FIG. 1, the first circuit layer 10 includes a plurality of first signal traces 101 and a plurality of first ground traces 103. In particular, the first signal traces 101 and the first ground traces 103 are alternatively arranged on the first circuit layer 10 along a Y-axis direction (i.e., a direction parallel to the first circuit layer 10).

The first signal traces 101 each has a first signal trace width sw1, and the first ground traces 103 each has a first ground trace width gw1. In some embodiments, the first ground trace width gw1 is greater than or is equal to the first signal trace width sw1 to provide shielding. In such arrangements, the crosstalk between the first signal traces 101 can be reduced.

In some embodiments, one of the first signal traces 101 is spaced at a first spacing ed1 from adjacent one of the first ground traces 103. In other words, the first signal trace 101 and the first ground trace 103 which are adjacent are spaced at the first spacing ed1.

As shown in FIG. 1, the first dielectric layer 15 has a first thickness dh1 in the Z-axis direction. In some embodiments, the first spacing ed1 substantially ranges from 0.78 to 1.96 times the first thickness dh1. By such arrangements, the semiconductor wiring substrate 100 can effectively restrict the electromagnetic wave coupling between multiple signal traces, so as to have better signal quality.

In some embodiments, the first signal trace width sw1 of the first signal traces 101 substantially ranges from 1.5 to 3 μm, and the first ground trace width gw1 of the first ground traces 103 substantially ranges from 3 to 4.5 μm. In such arrangements, the length of the first spacing ed1 can be controlled between 0.78 and 1.96 times the first thickness dh1.

As shown in FIG. 1 again, the second circuit layer 20 has a structure similar to that of the first circuit layer 10. In particular, the second circuit layer includes a plurality of second signal traces 201 and a plurality of second ground traces 203. The second signal traces 201 and the second ground traces 203 are alternatively arranged on the second circuit layer 20 along the Y-axis direction. The second signal traces 201 each has a second signal trace width sw2, and the second ground traces 203 each has a second ground trace width gw2. One of the second signal traces 201 is spaced at a second spacing ed2 from adjacent one of the second ground traces 203.

In some embodiments, the second ground trace width gw2 is greater than or is equal to the second signal trace width sw2, so that the crosstalk between the second signal traces 201 can be reduced.

In some embodiments, the second signal trace width sw2 substantially ranges from 1.5 to 3 μm, the second ground trace width gw2 substantially ranges from 3 to 4.5 μm, and the second spacing ed2 substantially ranges from to 1.96 times the first thickness dh1. In such way, the semiconductor wiring substrate 100 has better signal quality.

In some embodiments, as shown in FIG. 1, a first projection PS12 of one of the first signal traces 101 on the second circuit layer 20 along the Z-axis direction and one of the second ground traces 203 are partially overlapped. In addition, a second projection PG12 of one of the first ground traces 103 on the second circuit layer 20 along the Z-axis direction and one of the second signal traces 201 are partially overlapped.

Figure 2:
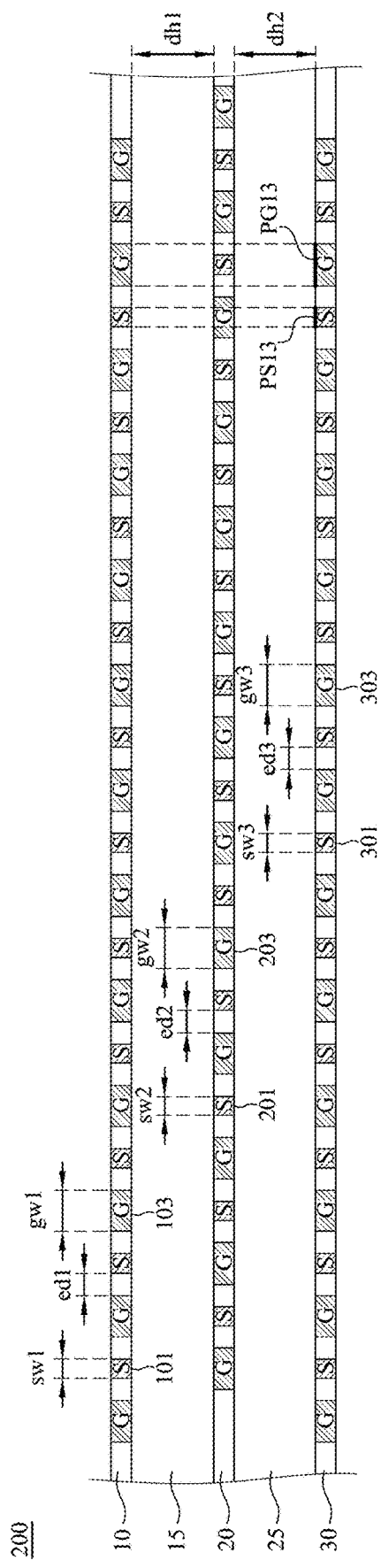
FIG. 2 is a partial schematic diagram of a semiconductor wiring substrate in accordance with some embodiments of the present disclosure.

Referring to FIG. 2, FIG. 2 is a partial schematic diagram of a semiconductor wiring substrate 200 in accordance with some embodiments of the present disclosure. The structure of the semiconductor wiring substrate 200 is substantially the same as the structure of the semiconductor wiring substrate 100, and the difference therebetween is that the semiconductor wiring substrate 200 further includes a second dielectric layer 25 and a third circuit layer 30. In the semiconductor wiring substrate 200 of FIG. 2, the components same as those of the semiconductor wiring substrate 100 of FIG. 1 are presented by same symbol and are not described herein.

In some embodiments, as shown in FIG. 2, the second dielectric layer 25 is between the second circuit layer 20 and the third circuit layer 30. In other words, the first circuit layer 10, the first dielectric layer 15, the second circuit layer 20, the second dielectric layer 25 and the third circuit layer 30 are arranged sequentially along the Z-axis direction (i.e., the arrangement direction).

As shown in FIG. 2, the third circuit layer 30 has a structure similar to that of the first circuit layer 10 or the second circuit layer 20. In particular, the third circuit layer 30 includes a plurality of third signal traces 301 and a plurality of third ground traces 303. The third signal traces 301 and the third ground traces 303 are alternatively arranged on the third circuit layer 30 along the Y-axis direction. The third signal traces 301 each has a third signal trace width sw3, and the third ground traces 303 each has a third ground trace width gw3. One of the third signal traces 301 is spaced at a third spacing ed3 from adjacent one of the third ground traces 303.

In some embodiments, the third ground trace width gw3 is greater than or is equal to the third signal trace width sw3, so that the crosstalk between the third signal traces 301 can be reduced.

As shown in FIG. 2 again, the second dielectric layer 25 has a second thickness dh2 in the Z-axis direction. In some embodiments, the third signal trace width sw3 substantially ranges from 1.5 to 3 μm, the third ground trace width gw3 substantially ranges from 3 to 4.5 μm, and the third spacing ed3 substantially ranges from 0.78 to 1.96 times the first thickness dh1 or the second thickness dh2.

In the embodiments of FIG. 1, the first spacing ed1 and the second spacing ed2 each substantially ranges from 0.78 to 1.96 times the first thickness dh1. However, the present disclosure is not limited herein. For example, in the embodiments of FIG. 2, the first spacing ed1 and the second spacing ed2 each substantially ranges from 0.78 to 1.96 times the first thickness dh1 or the second thickness dh2.

By the arrangements of the first spacing ed1, the second spacing ed2 and the third spacing ed3, the semiconductor wiring substrate 200 has better signal quality.

In some embodiments, a third projection PS13 of one of the first signal traces 101 on the third circuit layer 30 along the Z-axis direction and one of the third signal traces 301 are completely overlapped. In addition, a fourth projection PG13 of one of the first ground traces 103 on the third circuit layer 30 along the Z-axis direction and one of the third ground traces 303 are completely overlapped.

Figure 3:
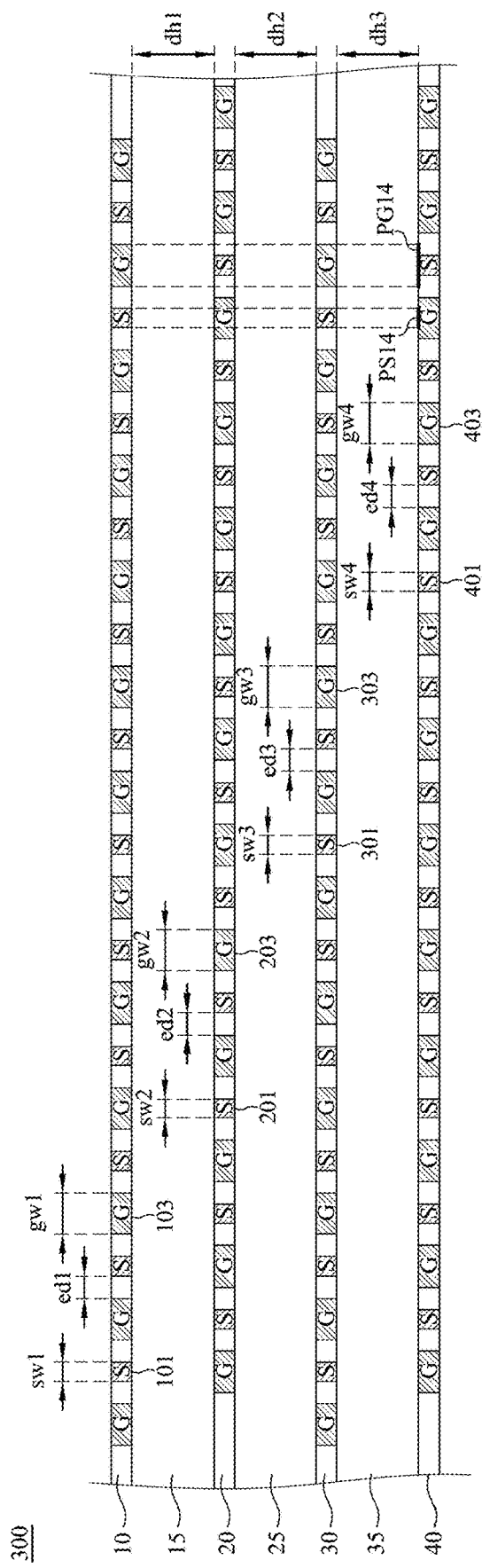
FIG. 3 is a partial schematic diagram of a semiconductor wiring substrate in accordance with some embodiments of the present disclosure.

Referring to FIG. 3, FIG. 3 is a partial schematic diagram of a semiconductor wiring substrate 300 in accordance with some embodiments of the present disclosure. The structure of the semiconductor wiring substrate 300 is substantially the same as the structure of the semiconductor wiring substrate 200, and the difference therebetween is that the semiconductor wiring substrate 300 further includes a third dielectric layer 35 and a fourth circuit layer 40. In the semiconductor wiring substrate 300 of FIG. 3, the components same as those of the semiconductor wiring substrate 200 of FIG. 2 are presented by same symbol and are not described herein.

In some embodiments, as shown in FIG. 3, the third dielectric layer 35 is between the third circuit layer 30 and the fourth circuit layer 40. In other words, the first circuit layer 10, the first dielectric layer 15, the second circuit layer 20, the second dielectric layer 25, the third circuit layer 30, the third dielectric layer and the fourth circuit layer 40 are arranged sequentially along the Z-axis direction (i.e., the arrangement direction).

As shown in FIG. 3, the fourth circuit layer 40 has a structure similar to that of the first circuit layer 10, the second circuit layer 20 or the third circuit layer 30. In particular, the fourth circuit layer 40 includes a plurality of fourth signal traces 401 and a plurality of fourth ground traces 403. The fourth signal traces 401 and the fourth ground traces 403 are alternatively arranged on the fourth circuit layer 40 along the Y-axis direction. The fourth signal traces 401 each has a fourth signal trace width sw4, and the fourth ground traces 403 each has a fourth ground trace width gw4. One of the fourth signal traces 401 is spaced at a fourth spacing ed4 from adjacent one of the fourth ground traces 403.

In some embodiments, the fourth ground trace width gw4 is greater than or is equal to the fourth signal trace width sw4, so that the crosstalk between the fourth signal traces 401 can be reduced.

As shown in FIG. 3 again, the third dielectric layer 35 has a third thickness dh3 in the Z-axis direction. In some embodiments, the fourth signal trace width sw4 substantially ranges from 1.5 to 3 μm, the fourth ground trace width gw4 substantially ranges from 3 to 4.5 μm, and the fourth spacing ed4 substantially ranges from 0.78 to 1.96 times the first thickness dh1, the second thickness dh2 or the third thickness dh3.

In the embodiments of FIG. 2, the first spacing ed1, the second spacing ed2 and the third spacing ed3 each substantially ranges from 0.78 to 1.96 times the first thickness dh1 or the second thickness dh2. However, the present disclosure is not limited herein. For example, the first spacing ed1, the second spacing ed2 and the third spacing ed3 each substantially ranges from 0.78 to 1.96 times the first thickness dh1, the second thickness dh2 or the third thickness dh3.

By the arrangements of the first spacing ed1, the second spacing ed2, the third spacing ed3 and the fourth spacing ed4, the semiconductor wiring substrate 300 has better signal quality.

In some embodiments, as shown in FIG. 3, a fifth projection PS14 of one of the first signal traces 101 on the fourth circuit layer 40 along the Z-axis direction and one of the fourth ground traces 403 are partially overlapped. In addition, a sixth projection PG14 of one of the first ground traces 103 on the fourth circuit layer 40 along the Z-axis direction and one of the fourth signal traces 401 are partially overlapped.

It can be seen from the above embodiments of FIGS. 1-3 that the first signal traces 101, the second ground traces 203, the third signal traces 301 and the fourth ground traces 403 are arranged along the Z-axis direction, and that the first ground traces 103, the second signal traces 201, the third ground traces 303 and the fourth signal traces 401 are arranged along the Z-axis direction.

It can be appreciated that the first signal trace width sw1, the second signal trace width sw2, the third signal trace width sw3 and the fourth signal trace width sw4 can be all same or all different, or can be part same, part different. The first ground trace width gw1, the second ground trace width gw2, the third ground trace width gw3 and the fourth ground trace width gw4 can be all same or all different, or can be part same, part different. The first spacing ed1, the second spacing ed2, the third spacing ed3 and the fourth spacing ed4 can be all same or all different, or can be part same, part different. In addition, the first thickness dh1, the second thickness dh2, the third thickness dh3 and the fourth thickness dh4 can be all same or all different, or can be part same, part different.

Figure 4:
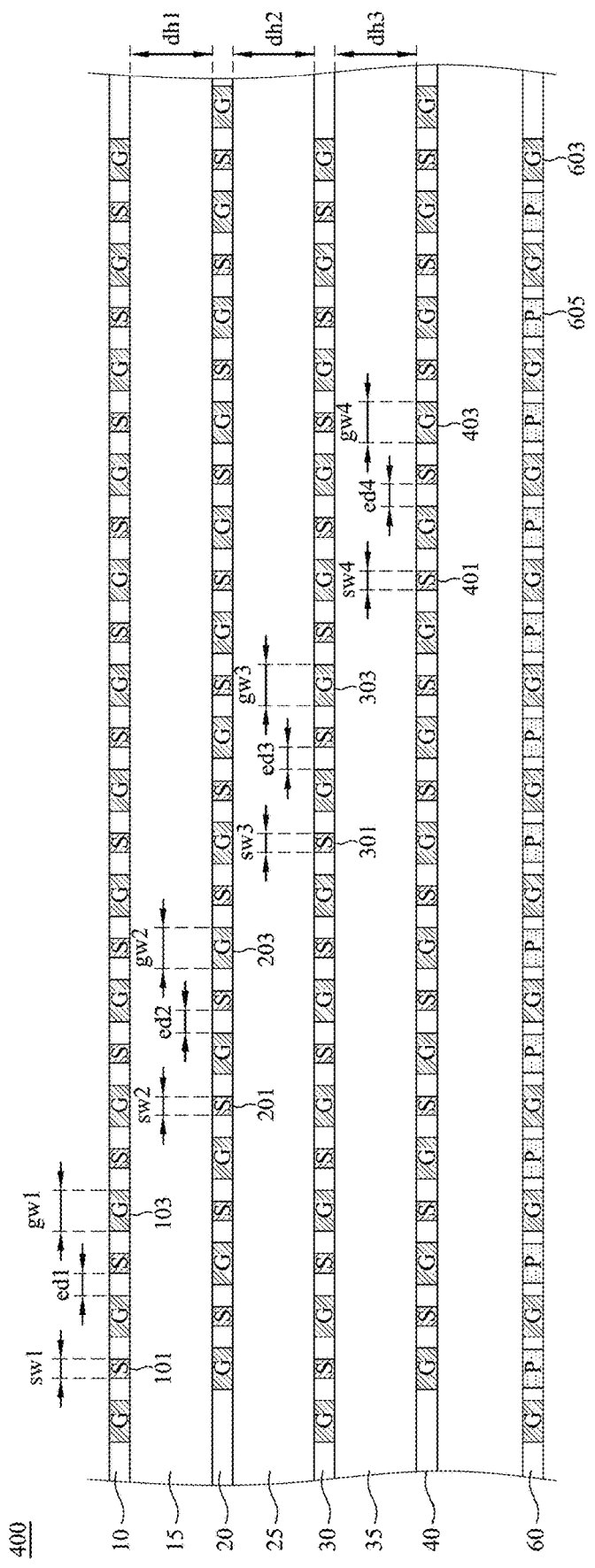
FIG. 4 is a partial schematic diagram of a semiconductor wiring substrate in accordance with some embodiments of the present disclosure.

Referring to FIG. 4, FIG. 4 is a partial schematic diagram of a semiconductor wiring substrate 400 in accordance with some embodiments of the present disclosure. The structure of the semiconductor wiring substrate 400 is substantially the same as the structure of the semiconductor wiring substrate 300, and the difference therebetween is that the semiconductor wiring substrate 400 further includes a power/ground layout layer 60. In the semiconductor wiring substrate 400 of FIG. 4, the components same as those of the semiconductor wiring substrate 300 of FIG. 3 are presented by same symbol and are not described herein.

In the embodiments of FIG. 4, the power/ground layout layer 60 is arranged below the fourth circuit layer 40 and includes a plurality of ground traces 603 and a plurality of power traces 605. In particular, the ground traces 603 and the power traces 605 are alternatively arranged on the power/ground layout layer 60 along the Y-axis direction. However, the present disclosure is not limited herein. For example, in some embodiments, the power/ground layout layer 60 is arranged above the first circuit layer 10.

In the above embodiments, the first dielectric layer 15, the second dielectric layer 25 and the third dielectric layer 35 each is a structure without conductive via (e.g., through-silicon via) or shielding, because the signal exchange between two adjacent circuit layers in the semiconductor wiring substrate can be effectively shielded in the arrangements of the first thickness dh1, the second thickness dh2 and the third thickness dh3.

Figure 5:
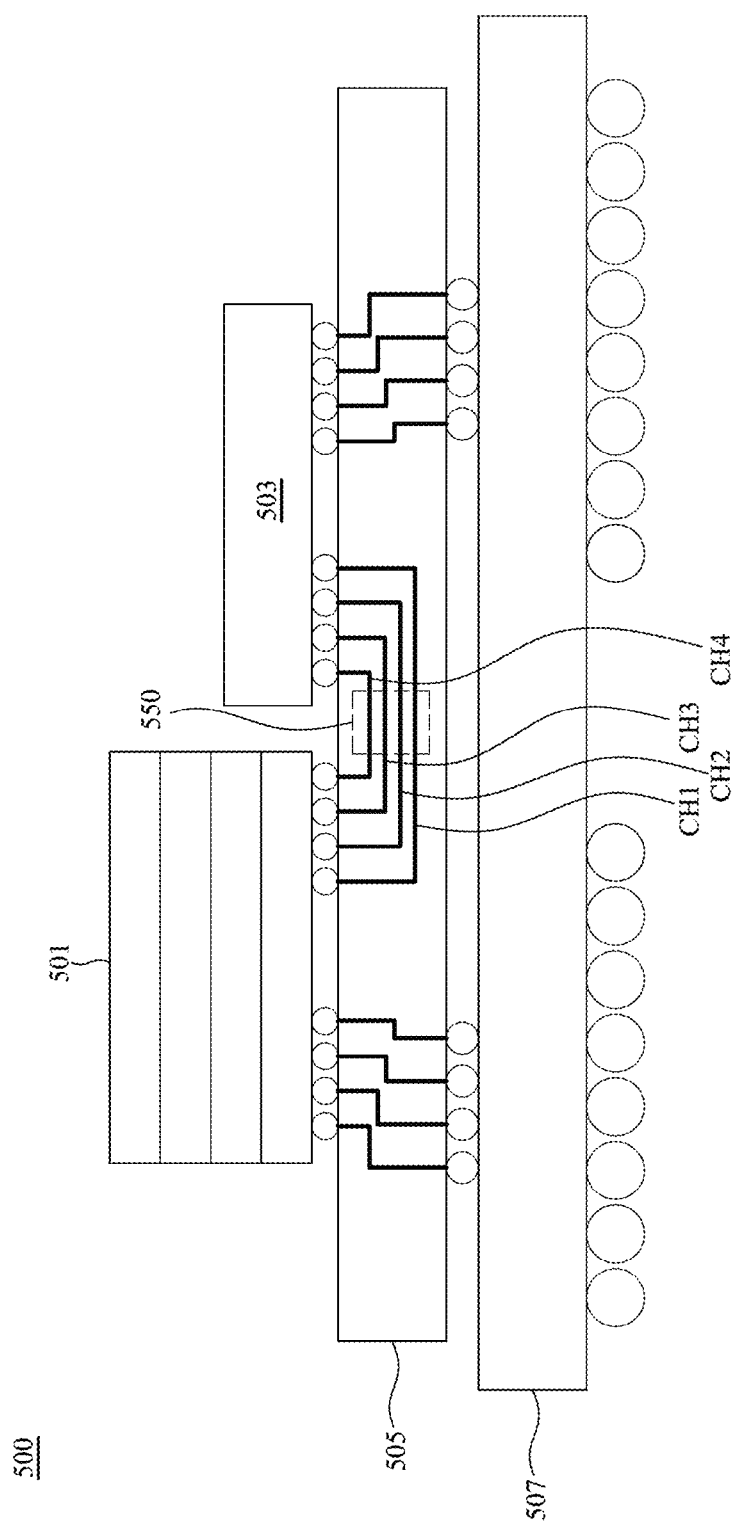
FIG. 5 is a partial schematic diagram of a semiconductor package device in accordance with some embodiments of the present disclosure.

Referring to FIG. 5, FIG. 5 is a partial schematic diagram of a semiconductor package device 500 in accordance with some embodiments of the present disclosure. In some embodiments, the semiconductor package device 500 includes a memory chip 501 (i.e., a first chip), a processing chip 503 (i.e., a second chip), an interposer 505 and a package substrate 507. In structure, as shown in FIG. 5, the memory chip 501 and the processing chip 503 are connected to a first surface of the interposer 505 by multiple bonding pads and multiple solder balls, and the package substrate 507 is connected to a second surface of the interposer 505 by multiple bonding pads and multiple solder balls, wherein the first surface (e.g., a top surface) and the second surface (e.g., a bottom surface) of the interposer 505 are opposite to each other.

In some embodiments, the processing chip 503 is electrically coupled to the memory chip 501 via the interposer 505 and is configured to perform a transmission of at least one signal (not shown) with the memory chip 501 via at least one channel. For example, as shown in FIG. 5, the at least one channel includes a first channel CH1, a second channel CH2, a third channel CH3 and a fourth channel CH4. Corresponding to the multiple channels CH1-CH4, the at least one signal includes a first signal transmitted in the first channel CH1, a second signal transmitted in the second channel CH2, a third signal transmitted in the third channel CH3 and a fourth signal transmitted in the fourth channel CH4.

In some embodiments, the interposer 505 includes a semiconductor wiring substrate 550. It can be appreciated that the semiconductor wiring substrate 550 can be implemented by one of the multiple semiconductor wiring substrates in the above embodiments. For example, the semiconductor wiring substrate 550 is implemented by the semiconductor wiring substrate 400.

Following the above descriptions, the first circuit layer 10 of the semiconductor wiring substrate 400 is electrically coupled between the processing chip 503 and the memory chip 501 to be the first channel CH1, so that the processing chip 503 and the memory chip 501 transmit the first signal via the first signal traces 101 of the first circuit layer 10. The second circuit layer 20 of the semiconductor wiring substrate 400 is electrically coupled between the processing chip 503 and the memory chip 501 to be the second channel CH2, so that the processing chip 503 and the memory chip 501 transmit the second signal via the second signal traces 201 of the second circuit layer 20. The third circuit layer 30 of the semiconductor wiring substrate 400 is electrically coupled between the processing chip 503 and the memory chip 501 to be the third channel CH3, so that the processing chip 503 and the memory chip 501 transmit the third signal via the third signal traces 301 of the third circuit layer 30. The fourth circuit layer 40 of the semiconductor wiring substrate 400 is electrically coupled between the processing chip 503 and the memory chip 501 to be the fourth channel CH4, so that the processing chip 503 and the memory chip 501 transmit the fourth signal via the fourth signal traces 401 of the fourth circuit layer 40.

In some embodiments, the power/ground layout layer 60 of the semiconductor wiring substrate 400 is electrically coupled between the processing chip 503 and the memory chip 501 and is configured to transmit the supply power.

In the embodiments of FIG. 5, the memory chip 501 can be implemented by high-bandwidth memory, and the processing chip 503 can be implemented by system on chip (SoC).

It can be appreciated that the first signal, the second signal, the third signal and the fourth signal can be all same or all different, or can be part same, part different. In addition, each signal can include multiple sub-signals (e.g., data signal, address signal, clock signal, control signal, etc.). Notably, because each signal is transmitted on the corresponding circuit layer, the impedance distribution of each circuit layer is uniform and the delay or skew between multiple sub-signals is reduced so as to improve signal quality.

Figure 6:
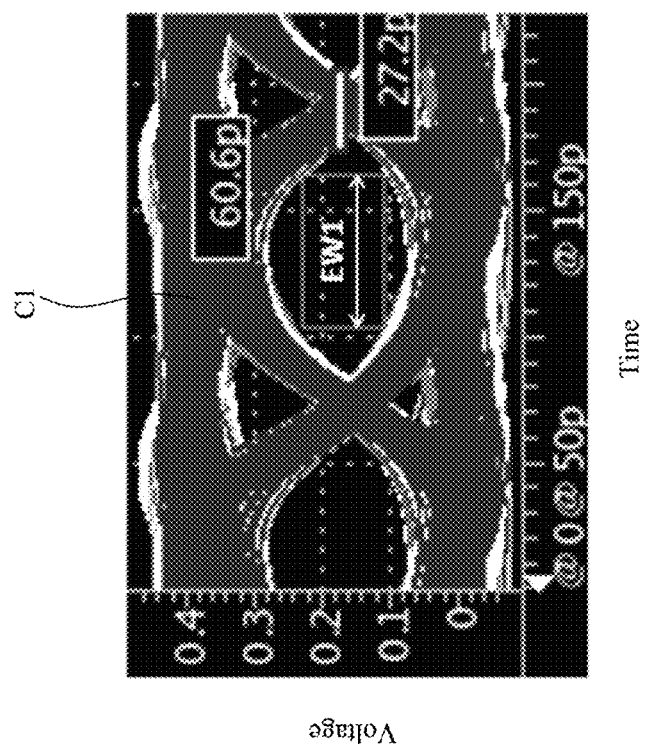
FIG. 6 is signal eye diagrams of a semiconductor package device using known art and a semiconductor package device using a configuration of the present disclosure.
Figure 6:
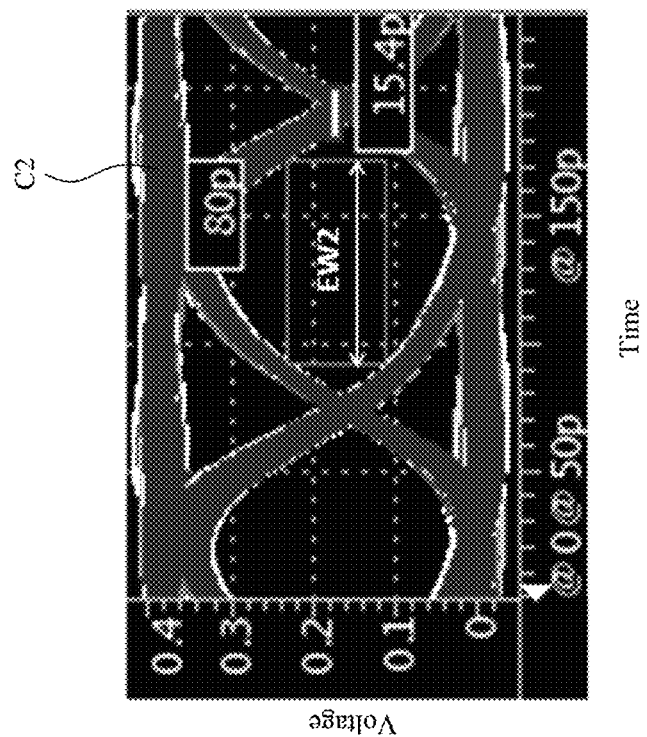

Referring to FIG. 6, FIG. 6 is signal eye diagrams of a semiconductor package device using known art and a semiconductor package device using a configuration of the present disclosure. As shown in FIG. 6, a curve C1 presents the signal eye diagram of the semiconductor package device using known art, and a curve C2 presents the signal eye diagram of the semiconductor package device using the configuration of the present disclosure. It can be seen from FIG. 6 that the semiconductor package device (e.g., the semiconductor package device 500) using the configuration of the present disclosure has better eye width in comparison to the known art. For example, an eye width EW2 of the curve C2 is increased by about 32% in comparison to an eye width EW1 of the curve C1. In addition, the semiconductor package device using the configuration of the present disclosure has higher data transfer rate (e.g., 8.4 Gbps).

As can be seen from the above embodiments of the present disclosure, by making the spacing between adjacent signal trace and ground trace and the thickness of the dielectric layer reach an appropriate ratio and making the signal in each channel between the memory chip and the processing chip transmit by the corresponding circuit layer, the semiconductor package device and the semiconductor wiring substrate of the present disclosure has the advantage of improving signal integrity, so as to achieve a higher data transfer rate.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A semiconductor wiring substrate, comprising:
   a first circuit layer comprising a plurality of first signal traces and a plurality of first ground traces, wherein the first signal traces and the first ground traces are alternatively arranged on the first circuit layer, and one of the first signal traces is spaced at a first spacing from adjacent one of the first ground traces;
   a second circuit layer comprising a plurality of second signal traces and a plurality of second ground traces, wherein the second signal traces and the second ground traces are alternatively arranged on the second circuit layer; and
   a first dielectric layer between the first circuit layer and the second circuit layer and having a first thickness in an arrangement direction of the first circuit layer, the first dielectric layer and the second circuit layer, wherein the first spacing substantially ranges from 0.78 to 1.96 times the first thickness.

2. The semiconductor wiring substrate of claim 1, wherein a first projection of one of the first signal traces on the second circuit layer along the arrangement direction and one of the second ground traces are partially overlapped, and a second projection of one of the first ground traces on the second circuit layer along the arrangement direction and one of the second signal traces are partially overlapped.

3. The semiconductor wiring substrate of claim 1, wherein one of the second signal traces is spaced at a second spacing from adjacent one of the second ground traces.

4. The semiconductor wiring substrate of claim 3, wherein the second spacing substantially ranges from 0.78 to 1.96 times the first thickness.

5. The semiconductor wiring substrate of claim 3, further comprising:
   a third circuit layer comprising a plurality of third signal traces and a plurality of third ground traces, wherein the third signal traces and the third ground traces are alternatively arranged on the third circuit layer; and
   a second dielectric layer between the second circuit layer and the third circuit layer and having a second thickness in the arrangement direction, wherein the second spacing substantially ranges from 0.78 to 1.96 times the second thickness.

6. The semiconductor wiring substrate of claim 5, wherein a third projection of one of the first signal traces on the third circuit layer along the arrangement direction and one of the third signal traces are completely overlapped, and a fourth projection of one of the first ground traces on the third circuit layer along the arrangement direction and one of the third ground traces are completely overlapped.

7. The semiconductor wiring substrate of claim 5, wherein one of the third signal traces is spaced at a third spacing from adjacent one of the third ground traces.

8. The semiconductor wiring substrate of claim 7, wherein the third spacing substantially ranges from 0.78 to 1.96 times the first thickness or the second thickness.

9. The semiconductor wiring substrate of claim 7, further comprising:
 a fourth circuit layer comprising a plurality of fourth signal traces and a plurality of fourth ground traces, wherein the fourth signal traces and the fourth ground traces are alternatively arranged on the fourth circuit layer; and
 a third dielectric layer between the third circuit layer and the fourth circuit layer and having a third thickness in the arrangement direction, wherein the third spacing substantially ranges from 0.78 to 1.96 times the third thickness.

10. The semiconductor wiring substrate of claim 9, wherein a fifth projection of one of the first signal traces on the fourth circuit layer along the arrangement direction and one of the fourth ground traces are partially overlapped, and a sixth projection of one of the first ground traces on the fourth circuit layer along the arrangement direction and one of the fourth signal traces are partially overlapped.

11. The semiconductor wiring substrate of claim 9, wherein one of the fourth signal traces is spaced at a fourth spacing from adjacent one of the fourth ground traces, and the fourth spacing substantially ranges from 0.78 to 1.96 times the first thickness, the second thickness or the third thickness.

12. A semiconductor package device, comprising:
 a first chip;
 a second chip configured to perform a transmission of at least one signal with the first chip via at least one channel;
 a package substrate; and
 an interposer comprising a semiconductor wiring substrate, a first surface and a second surface, wherein the first surface and the second surface are opposite to each other, the first chip and the second chip are connected to the first surface, and the package substrate is connected to the second surface;
 wherein the semiconductor wiring substrate comprises at least one circuit layer and at least one dielectric layer, and a first circuit layer of the at least one circuit layer is electrically coupled between the second chip and the first chip to be a first channel of the at least one channel, so that the second chip and the first chip transmit a first signal of the at least one signal via the first circuit layer;
 wherein the first circuit layer comprises a plurality of first signal traces and a plurality of first ground traces, wherein the first signal traces and the first ground traces are alternatively arranged on the first circuit layer, and one of the first signal traces is spaced at a first spacing from adjacent one of the first ground traces;
 wherein a first dielectric layer of the at least one dielectric layer has a first thickness in an arrangement direction of the at least one circuit layer and the at least one dielectric layer, and the first spacing substantially ranges from 0.78 to 1.96 times the first thickness.

13. The semiconductor package device of claim 12, wherein the at least one circuit layer further comprises:
 a second circuit layer comprising a plurality of second signal traces and a plurality of second ground traces, wherein the second signal traces and the second ground traces are alternatively arranged on the second circuit layer, and one of the second signal traces is spaced at a second spacing from adjacent one of the second ground traces;
 wherein the first dielectric layer is between the first circuit layer and the second circuit layer.

14. The semiconductor package device of claim 13, wherein the second spacing substantially ranges from 0.78 to 1.96 times the first thickness.

15. The semiconductor package device of claim 13, wherein the at least one circuit layer further comprises:
 a third circuit layer comprising a plurality of third signal traces and a plurality of third ground traces, wherein the third signal traces and the third ground traces are alternatively arranged on the third circuit layer, and one of the third signal traces is spaced at a third spacing from adjacent one of the third ground traces;
 wherein the at least one dielectric layer further comprises a second dielectric layer, and the second dielectric layer is between the second circuit layer and the third circuit layer and has a second thickness in the arrangement direction;
 wherein the second spacing substantially ranges from 0.78 to 1.96 times the second thickness.

16. The semiconductor package device of claim 15 wherein the third spacing substantially ranges from 0.78 to 1.96 times the first thickness or the second thickness.

17. The semiconductor package device of claim 15, wherein the at least one circuit layer further comprises:
 a fourth circuit layer comprising a plurality of fourth signal traces and a plurality of fourth ground traces, wherein the fourth signal traces and the fourth ground traces are alternatively arranged on the fourth circuit layer, and one of the fourth signal traces is spaced at a fourth spacing from adjacent one of the fourth ground traces;
 wherein the at least one dielectric layer further comprises a third dielectric layer, and the third dielectric layer is between the third circuit layer and the fourth circuit layer and has a third thickness in the arrangement direction;
 wherein the third spacing substantially ranges from 0.78 to 1.96 times the third thickness.

18. The semiconductor package device of claim 17, wherein the fourth spacing substantially ranges from 0.78 to 1.96 times the first thickness, the second thickness or the third thickness.

19. The semiconductor package device of claim 17, wherein the semiconductor wiring substrate further comprises:
 a power/ground layout layer electrically coupled between the second chip and the first chip.

20. The semiconductor package device of claim 17, wherein the first signal traces, the second ground traces, the third signal traces and the fourth ground traces are arranged along the arrangement direction, and the first ground traces, the second signal traces, the third ground traces and the fourth signal traces are arranged along the arrangement direction.

* * * * *